(12) United States Patent
Lee et al.

(10) Patent No.: US 6,351,067 B2
(45) Date of Patent: *Feb. 26, 2002

(54) ORGANIC ELECTROLUMINESCENT DEVICE WITH IMPROVED HOLE INJECTING STRUCTURE

(75) Inventors: Shuit-Tong Lee; Zhen-Bo Deng; William Alexander Gambling, all of Kowloon (HK)

(73) Assignee: City University of Hong Kong, Kowloon (HK)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,457

(22) Filed: Jan. 21, 1999

(51) Int. Cl.⁷ ................................................. H05B 33/26
(52) U.S. Cl. ........................ 313/504; 313/506; 313/509; 428/917
(58) Field of Search ................................. 313/504, 505, 313/506, 503, 509; 428/690, 917

(56) References Cited

U.S. PATENT DOCUMENTS

| | | | |
|---|---|---|---|
| 3,172,862 A | 3/1965 | Gurnee et al. .......... | 252/301.3 |
| 3,173,050 A | 3/1965 | Gurnee ................... | 313/108 |
| 3,710,167 A | 1/1973 | Dresner et al. ......... | 313/108 |
| 4,356,429 A | 10/1982 | Tang ...................... | 313/503 |
| 4,757,235 A | * 7/1988 | Nunomura et al. ..... | 313/506 |
| 4,885,211 A | 12/1989 | Tang et al. ............. | 428/457 |
| 5,061,569 A | 10/1991 | VanSlyke et al. ...... | 428/457 |
| 5,317,169 A | * 5/1994 | Nakano et al. ......... | 257/40 |
| 5,530,269 A | * 6/1996 | Tang ...................... | 313/504 |
| 5,608,287 A | 3/1997 | Hung et al. ............ | 313/503 |
| 5,668,438 A | 9/1997 | Shi et al. ............... | 313/504 |
| 5,734,225 A | * 3/1998 | Biebuyck et al. ...... | 313/506 |
| 5,741,626 A | * 4/1998 | Jain et al. .............. | 430/314 |
| 5,776,623 A | 7/1998 | Hung et al. ............ | 428/690 |
| 5,783,292 A | 7/1998 | Tokito et al. .......... | 428/212 |
| 5,932,964 A | * 8/1999 | McCann et al. ........ | 313/498 |
| 5,969,474 A | * 10/1999 | Arai ....................... | 313/504 |
| 6,067,222 A | * 5/2000 | Hausmann .............. | 361/234 |
| 6,140,763 A | * 10/2000 | Hung et al. ............ | 313/506 X |

* cited by examiner

*Primary Examiner*—Ashok Patel
(74) *Attorney, Agent, or Firm*—Jacobson Holman, PLLC

(57) ABSTRACT

An organic electroluminescent device (OELD) with improved luminescent efficiency has been fabricated upon inclusion of an inorganic buffer layer in the hole injecting or electron injecting regions. The structure of the device can be as follows (from bottom to top): ITO\buffer layer\NPB\Alq\Mg:Ag. In comparison with devices without the buffer layer, the present OELD may be more efficient in a proper bias condition.

19 Claims, 3 Drawing Sheets

Dependence of EL efficiency and current density with different thickness of buffer layer.

ORGANIC ELECTROLUMINESCENT DEVICE WITH IMPROVED HOLE INJECTING STRUCTURE

FIELD OF THE INVENTION

The present invention pertains to organic thin-film electroluminescent devices and a method of manufacture of such devices.

BACKGROUND TO THE INVENTION

Fabrication of organic electroluminescent devices (OELDs) can be traced back to 1960's. Representatives of early OELDs are U.S. Pat. No. 3,172,862 to Gurnee et al, issued Mar. 9, 1965; U.S. Pat. No. 3,173,050 to Gurnee, issued Mar. 9, 1965; and U.S. Pat. No. 3,710,167 to Dresner, issued Jan. 9, 1973. These devices comprised a single organic emitting layer having thicknesses above 1 mm and two electrodes (cathode and anode). Alkali metals were used as the cathode materials as they had the lowest work function values.

U.S. Pat. No. 4,356,429 to Tang et al disclosed an OELD with two organic layers, in which the organic luminescent medium consisted of two extremely thin layers separating the anode and the cathode. These comprised one layer injecting and transporting holes and the other layer injecting and transporting electrons and also acting as the organic luminescent zone of the device.

Improvements were then achieved by using different cathode materials. U.S. Pat. No. 4,885,211 to Tang et al disclosed an OELD with its cathode comprising a layer of a plurality of metals other than single alkali metals, at least one of the metals having a work function of less than 4 eV. U.S. Pat. No. 5,608,287 to Hung et al. disclosed OELDs having a conductive electron injector. U.S. Pat. No. 5,668,438 to Shi et al disclosed an OELD in which the materials making up the electron transporting layer (ETL) and the hole transporting layer (HTL) were selected so that the energy barrier for hole injection from the HTL to the ETL was substantially higher than the energy barrier for electron injection from the ETL to the HTL. In that case, light was emitted from the HTL rather than the ETL.

More recently, U.S. Pat. No. 5,776,623 to Hung et al disclosed an OELD containing a transparent electron-injecting electrode. The electrode included a thin non-conductive layer contacting the electroluminescent layer and a conductive transparent overcoat layer. The thickness of the nonconductive layer was selected so that the bilayer acted as an electron injecting contact and provided stability against atmospheric corrosion.

However, only very few patents have dealt with the hole injecting structure. U.S. Pat. No. 5,061,569 to Vanslyke et al disclosed an internal junction OELD in which the hole injecting and transporting zone included a tertiary amine containing at least two tertiary amine moieties and including, attached to a tertiary amine nitrogen atom, an aromatic moiety containing at least two fused aromatic rings. U.S. Pat. No. 5,783,292 to Tokito et al disclosed an OELD in which organic-inorganic composite thin film was used.

SUMMARY OF THE INVENTION

It is an object of the present invention to provide an OELD with an increased electroluminescent efficiency and/ or improved stability or which will at least provide the public with a useful choice.

This invention comprises an OELD and method of manufacture in which an inorganic buffer layer is included in the hole injecting region.

Preferably, the device comprises in order: an ITO-covered glass substrate which behaves as the hole injector and is transparent and transmissive to optical radiation, a layer of inorganic material as a buffer to the hole injection, an organic single layer or multilayer structure for electroluminescence and carrier confinement, and a layer of low-work-function material as an electron injector which is stable relative to atmospheric corrosion. The buffer layer may also be included in the electron injecting region.

BRIEF DESCRIPTION OF THE DRAWINGS

Preferred embodiments of this invention can be better appreciated by reference to the following description considered in conjunction with the drawings in which.

DETAILED DESCRIPTION OF THE PREFERRED EMBODIMENTS

Figure 1:
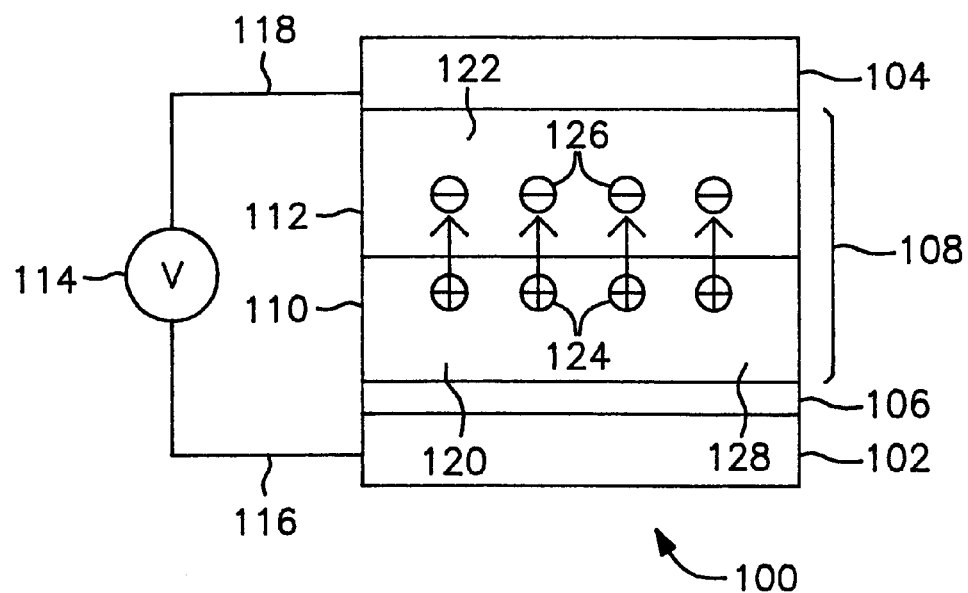
FIGS. 1 and 2 which are schematic diagrams of an embodiment of the OELD of the invention.

An electroluminescent (EL) device 100 of the invention is schematically illustrated in FIG. 1. Anode 102 is separated from cathode 104 by an inorganic buffer layer 106 and an organic luminescent medium 108, which, as shown in this embodiment, consists of two superimposed layers. Layer 110, which is located above the buffer layer 106, forms a hole injecting zone of the organic luminescent medium. Above layer 110 is layer 112, which forms an electron transporting zone of the organic luminescent medium. The anode and the cathode are connected to an external AC or DC power source 114 by conductors 116 and 118, respectively. The power source can be pulsed or continuous wave.

When the EL device 100 is forward biased, i.e., the potential of the anode is higher than that of the cathode, there occurs injection of holes (positive charge carriers) into the lower organic layer, as schematically shown at 120, while electrons are injected into the upper organic layer, as schematically shown at 122, in the luminescent medium. The injected holes and electrons each migrate toward the oppositely charged electrode, as shown by the arrows 124 and 126, respectively. This results in hole-electron recombination. When a migrating electron drops from its conduction potential to a valence band in filing a hole, energy is released as light. Hence the organic luminescent medium forms between the electrodes a luminescent zone receiving mobile charge carriers from each electrode. Depending upon the choice of alternative constructions, the released light can be emitted from the organic luminescent material through one or more edges 128 of the organic luminescent medium separating the electrodes, through the anode, through the cathode, or through any combination of the foregoing.

Figure 2:
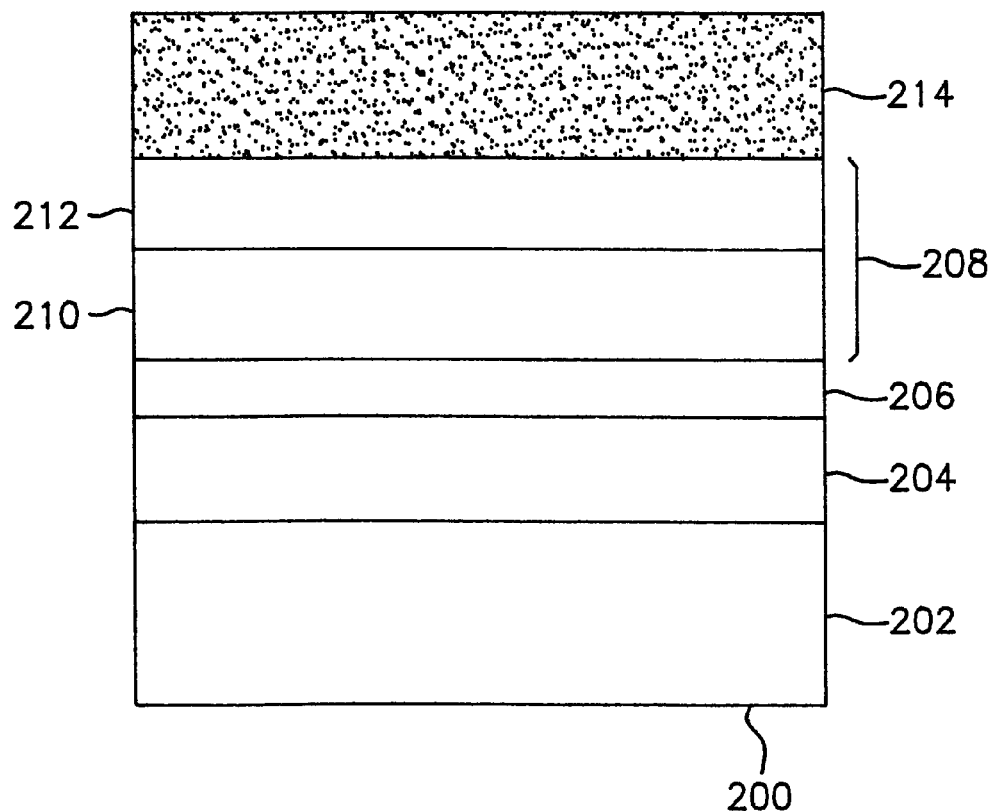

Organic EL device 200 shown in FIG. 2 is illustrative of one preferred embodiment of the invention. Same as in previous OELDs' fabrication, a transparent anode electrode is used in the present invention. Layer 202 is a transparent and insulating support onto which is deposited a conductive and light transmissive electrode 204. Typically, this layer is made from metal or metal oxide such as ITO. This layer, as an anode electrode, possesses a relatively high work function. Adjacent to 204 is the anode-combined buffer layer 206, which, in this embodiment, is selected from the group consisting of $SiO_x$, $Y_2O_3$, and $Ta_2O_5$, where x is from 1 to 2. Above 206 is the organic luminescent medium 208, consisting of hole injecting zone 210 and electron transporting zone 212 in which luminescence occurs. The top electrode 214 acts as the electron injector with a relatively low work function. It is usually either a single metal or a multi-metal mixture formed by codeposition in vacuum.

The preferred embodiments above describe an OELD which positions the buffer layer between the anode and the luminescent medium. The buffer layer may also increase efficiency when positioned between the cathode and the luminescent medium, for example, between the cathode and electron transporting layer. Furthermore, multiple buffer layers such as a buffer layer adjacent the anode and a further buffer layer adjacent the cathode are possible. There is no requirement for identical buffer layers in such a multi-layer structure with the buffer layers on opposed sides of the luminescent medium able to be of different materials or mixtures as required.

The buffer layers described have been selected from a particular group of oxides. In preferred embodiments, the buffer layer is chosen from insulating metal oxides, semiconductor oxides, diamond-like carbon and nitrogen doped carbon. Of course, a number of different materials may be used in the buffer layer to perform the same function. The list provided is not considered exhaustive.

The electroluminescent element contained within the device can comprise variety of materials found suitable for such purposes. These include the inclusion of molecules selected from Alq, TPD, NPB and TPBI as well as a variety of polymers. The polymers may include such polymers as poly (paraphenylene vinylene) (PPV), PPV copolymers and derivatives. Again, this is not an exhaustive list of possible materials for this element.

Similarly, the anode can be made from many suitable materials for the purpose. Typically such anodes are made from transparent conducting oxides. These include indium-tin-oxide, aluminum- or indium-doped zinc oxide, tin oxide, magnesium-indium-oxide and cadmium-tin-oxide.

EXAMPLES

The invention and its advantages are further illustrated by the specific examples which follow:

Example 1
Fabrication Procedure

An OELD satisfying the requirements of the invention was constructed in the following manner. The device structure has an inorganic buffer layer and a two organic-layer stack, namely hole transporting layer and fluorescent emitting and electron transporting layer.

An indium-tin-oxide coated glass substrate was sequentially ultrasonicated in a commercial detergent, rinsed in deionized water, degreased in organic solvent, such as ethanol and acetone, and exposed to ultraviolet light and ozone for a few minutes.

An inorganic buffer layer (0–200 Angstroms) was then deposited on top of the ITO coated substrate by evaporation.

Onto the buffer layer was deposited a hole transporting layer of TPD or NPB (500–1,500 Angstroms), evaporated from a tantalum boat.

A fluorescent emitting and electron transporting layer of Alq (600 Angstroms) was then deposited onto the hole transporting layer.

On top of the Alq layer was deposited a 1,500-Angstrom thick cathode formed of a 10:1 atomic ratio of Mg and Ag.

The above sequence completed the deposition of the OELD. The device was then packaged in a dry glove box for protection against ambient environment.

Example 2
OELDs with $SiO_2$ Buffer Layer

The OELDs were fabricated according to the procedure of Example 1. The buffer layers with different thicknesses of $SiO_2$ were used. Table 1 lists the EL luminance quantum efficiency measured in unit of candela per ampere, and luminance output under a constant current bias of 20 $mA/cm^2$.

TABLE 1

| $SiO_2$ Thickness (nm) | 0 | 0.5 | 1.0 | 1.5 |
|---|---|---|---|---|
| CIEx | 0.334 | 0.338 | 0.339 | 0.339 |
| CIEy | 0.562 | 0.563 | 0.562 | 0.562 |
| Luminance | 1,140 | 960 | 1,820 | 1,680 |
| Luminance Eff. (cd/A) | 5.7 | 4.8 | 9.1 | 8.4 |

Referring to the luminance efficiency, it can be observed that there may be a reduction in efficiency with a particularly thin layer. However, as shown in this example using $SiO_2$, the efficiency increases towards the thickness of 1 nm. There may then be a tailing off of efficiency as the thickness increases. This particular buffer layer is an insulating layer and will inhibit current as the layer thickness increases. The thickness as provided in this table shows the performance of $SiO_2$. Different thicknesses may provide different results with alternative materials used as the buffer layer.

Example 3
Brightness-Current-Voltage (B-I-V) Characteristics

Figure 3:
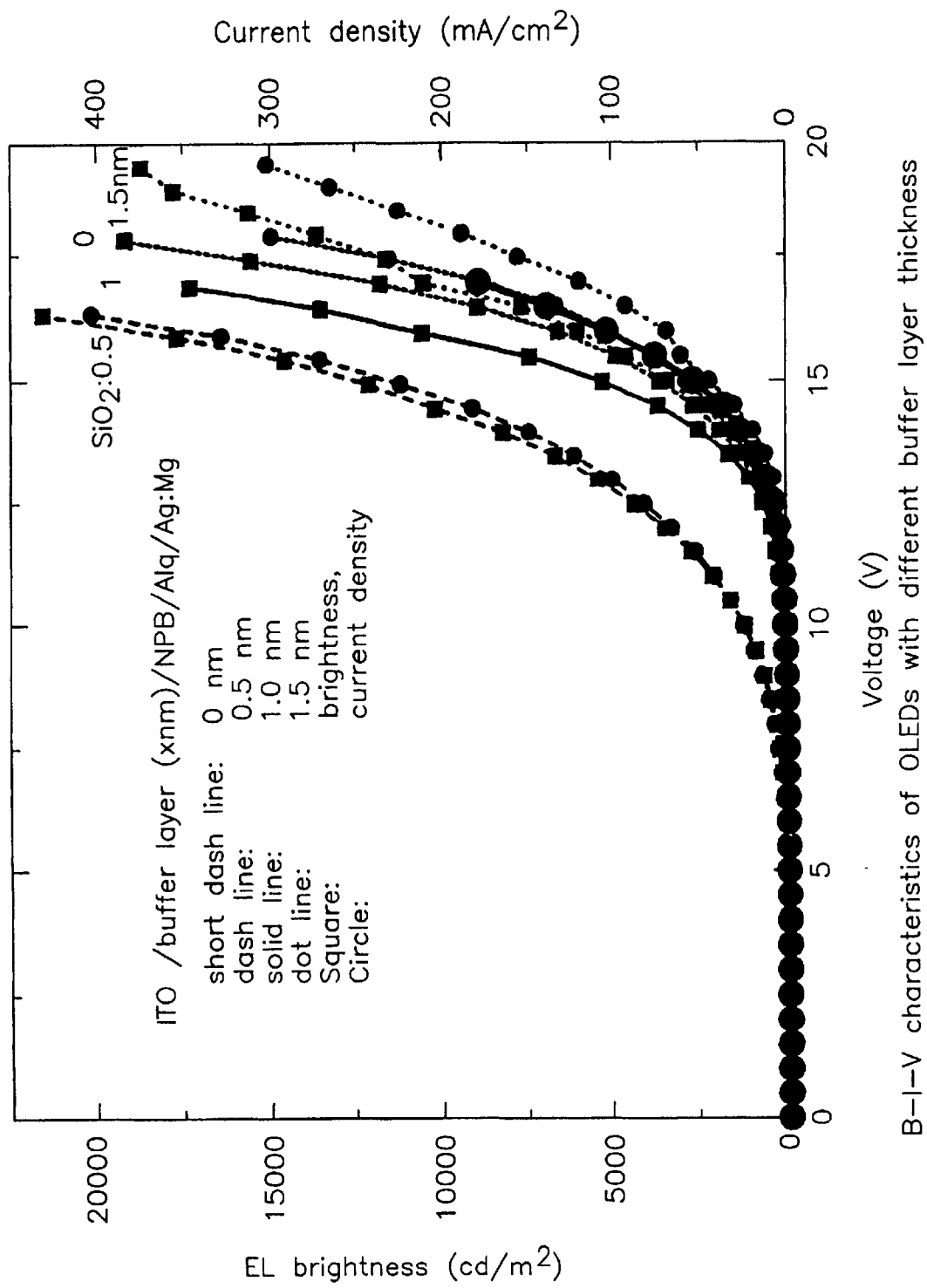
FIG. 3 is a graphical representation of the results of different thickness of buffer layer in terms of brightness.

The OELDs were fabricated according to the procedure of Example 1. FIG. 3 shows the B-I-V curves of four devices with different thicknesses of buffer layer ($SiO_2$).

Figure 4:
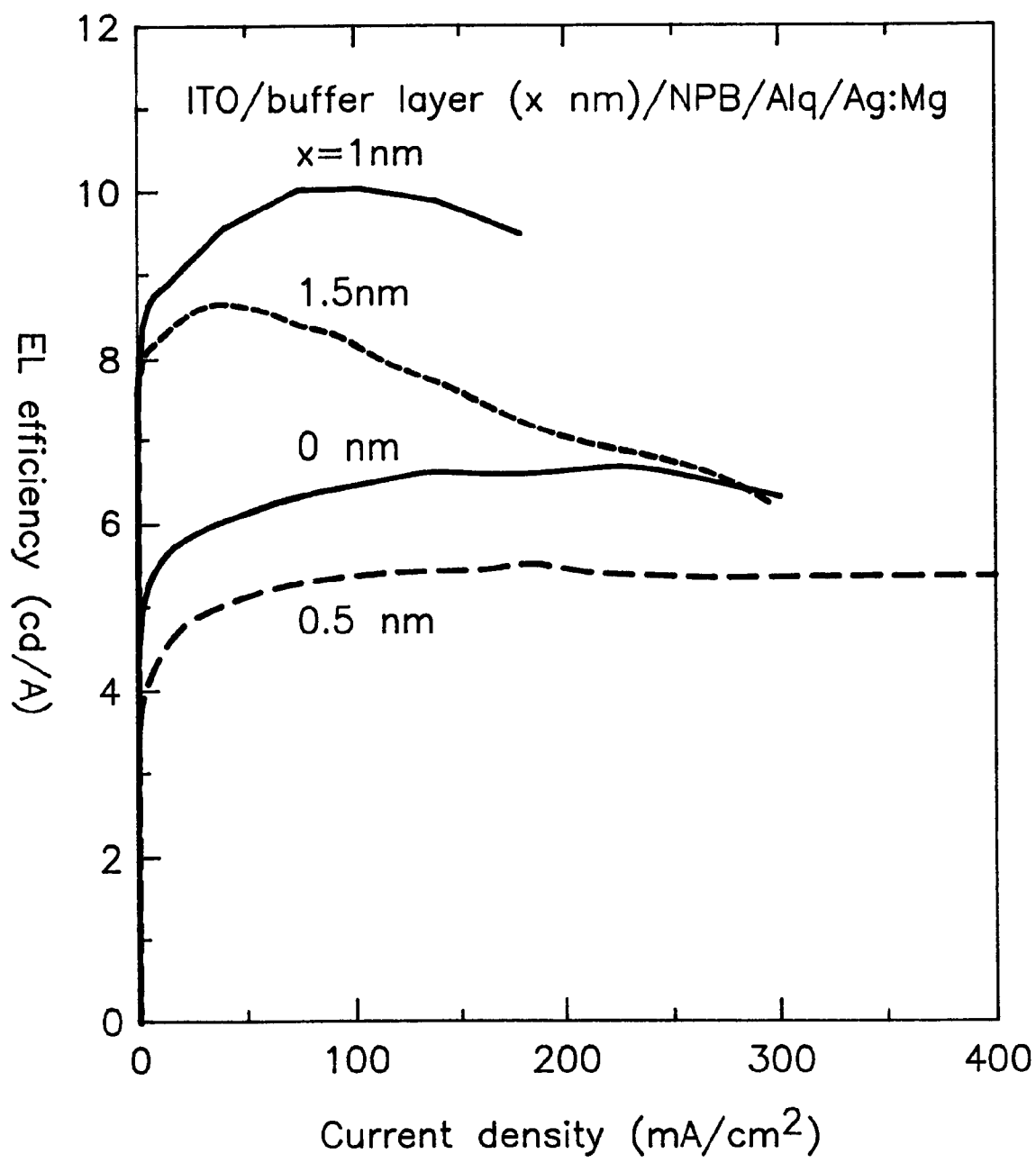
FIG. 4 is a graphical representation of the results of FIG. 3 in terms of electroluminescent efficiency.

Example 4
Quantum Efficiency of the Devices with Different Thicknesses of $SiO_2$ The OELDs were fabricated according to the procedure of Example 1. FIG. 4 shows the electroluminescent efficiency of the four devices with different thicknesses of buffer layer ($SiO_2$).

Example 5
OELDs with Different Buffer Layers

The OELDs were fabricated according to the procedure of Example 1. Buffer layers made of different inorganic materials, such as $SiO_2$, $Y_2O_3$ and $Ta_2O_5$ were used. Table 2 lists the EL luminance quantum efficiency measured in unit of candela per ampere and luminance output under a constant current bias of 20 $mA/cm^2$ (the thickness of the inorganic materials is about 1.0 nm).

TABLE 2

| Materials | $SiO_2$ | $Y_2O_3$ | $Ta_2O_5$ |
|---|---|---|---|
| CIEx | 0.339 | 0.334 | 0.335 |
| CIEy | 0.562 | 0.562 | 0.562 |
| Luminance | 1,820 | 1,280 | 1,360 |
| Luminance Eff. (cd/A) | 9.1 | 6.4 | 6.8 |

Example 6
Further Treatment of the Buffer Layer

The OELDs were fabricated according to the procedure of Example 1. The substrate with buffer layer was further treated by radiation, which effectively protects the surface of the buffer layer against harmful contamination. Even higher EL efficiency can be obtained thereby.

The fabrication procedure provided in the examples again discloses a method of manufacturing an OELD which incorporates a buffer layer between the cathode and anode. The examples given deposit the buffer layer onto the intended anode of the device. Again, it should be noted that the layer may be deposited prior to deposition of the cathode or onto the cathode be the device is deposited in reverse. The order of the layers in the examples are for these preferred embodiments only.

Further aspects of this invention may become apparent to those skill in the art to which the invention relates. It should be noted that integers referred to throughout the specification are deemed to incorporate known equivalents and the disclosure of the preferred embodiments did not be considered limiting to the scope of the invention as defined by the appended claims.

What is claimed is:

1. An organic electroluminescent device comprising:
   an anode;
   a cathode;
   an organic electroluminescent element disposed between the anode and the cathode, said organic electroluminescent element includes a first layer for forming an electron transport zone positioned near said cathode, and a second layer for forming a hole injecting zone positioned near said anode; and
   at least one inorganic dielectric buffer layer provided between said anode and said organic electroluminescent element.

2. The device as claimed in claim 1 wherein said organic electroluminescent element includes one hole transporting layer and one fluorescent emitting layer.

3. The device as claimed in claim 1 wherein said organic electroluminescent element includes one fluorescent emitting layer and one electron transporting layer.

4. The device as claimed in claim 1 wherein said organic electroluminescent element includes one hole transporting layer, one fluorescent emitting layer and one electron transporting layer.

5. The device as claimed in claim 1 wherein said buffer layer is disposed between the anode and the hole transporting layer.

6. The device as claimed in claim 3 wherein the buffer layer is disposed between the cathode and the electron transporting layer.

7. The device as claimed in claim 1 wherein said at least one inorganic dielectric buffer layer comprising a material selected from the group consisting of insulating metal oxides and semi conductor oxides.

8. The device as claimed in claim 7 wherein said metal oxides and semiconductor oxides including $Ta_2O_5$, $Y_2O_3$ and $SiO_x$, with x from 1 to 2.

9. The device as claimed in claim 1 wherein said buffer layer has a thickness ranging from 0 to 20 nm.

10. The device as claimed in claim 1 wherein said buffer layer has been treated by radiation.

11. The device as claimed in claim 1 wherein said organic electroluminescent element comprises materials including molecules selected from Alq, TPD, NPB and TPBI and polymers.

12. The device as claimed in claim 11 wherein said polymers include poly (paraphenylene vinylene) (PPV), PPV copolymers and derivatives.

13. The device as claimed in claim 1 wherein said anode is selected from transparent conducting oxides including indium-tin-oxide, aluminum- or indium-doped zinc oxide, tin oxide, magnesium-indium-oxide, and cadmium-tin-oxide.

14. A method of manufacturing an organic electroluminescent device comprising the steps of:
   providing an anode;
   providing a cathode;
   providing an organic electroluminescent element between said anode and said cathode, said organic electroluminescent element includes a first layer for forming an electron transport zone positioned near said cathode, and a second layer for forming a hole injecting zone positioned near said anode; and
   positioning an inorganic dielectric buffer layer between said anode and said organic electroluminescent element.

15. The method as claimed in claim 14 wherein said step of positioning said buffer layer comprises the further step of depositing a buffer layer onto at least one of said anode and cathode.

16. The method as claimed in claim 15 wherein said buffer layer is deposited onto said anode.

17. The method as claimed in claim 15 wherein said deposition is performed by evaporation.

18. The method as claimed in claim 14 wherein said buffer layer is provided having a thickness in a range of 0 to 200 Angstorms.

19. The method as claimed in claim 15 wherein said buffer layer is deposited onto said cathode.

* * * * *